(12) United States Patent
Ozaki et al.

(10) Patent No.: US 10,043,727 B2
(45) Date of Patent: Aug. 7, 2018

(54) COMPOUND SEMICONDUCTOR DEVICE AND METHOD OF MANUFACTURING THE SAME

(71) Applicant: FUJITSU LIMITED, Kawasaki-shi, Kanagawa (JP)

(72) Inventors: Shirou Ozaki, Yamato (JP); Naoya Okamoto, Isehara (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 15/043,882

(22) Filed: Feb. 15, 2016

(65) Prior Publication Data

US 2016/0247740 A1    Aug. 25, 2016

(30) Foreign Application Priority Data

Feb. 20, 2015   (JP) ................. 2015-032230

(51) Int. Cl.
| | |
|---|---|
| *H01L 21/00* | (2006.01) |
| *H01L 23/00* | (2006.01) |
| *H01L 23/29* | (2006.01) |
| *H01L 21/02* | (2006.01) |
| *H02M 3/335* | (2006.01) |
| *H03F 3/19* | (2006.01) |

(Continued)

(52) U.S. Cl.
CPC ........ *H01L 23/296* (2013.01); *H01L 21/0217* (2013.01); *H01L 21/02126* (2013.01); *H01L 21/02164* (2013.01); *H01L 21/02167* (2013.01); *H01L 21/02321* (2013.01); *H01L 21/02337* (2013.01); *H01L 23/3171* (2013.01); *H02M 3/33507* (2013.01); *H03F 1/3247* (2013.01); *H03F 3/19* (2013.01); *H03F 3/195* (2013.01); *H01L 23/3192* (2013.01); *H02M 1/4225* (2013.01); *H02M 3/337* (2013.01); *Y02B 70/126* (2013.01)

(58) Field of Classification Search
CPC ........... H01L 21/02126; H01L 21/0217; H01L 21/02164; H01L 21/02167; H01L 21/02321; H01L 21/02337; H01L 23/296; H01L 23/3171; H01L 23/3192; H03F 1/3247; H03F 3/195; H03F 3/19; H02M 1/4225; H02M 3/33507; H02M 3/337; Y02B 70/126

See application file for complete search history.

(56) References Cited

U.S. PATENT DOCUMENTS

| | | | | |
|---|---|---|---|---|
| 6,395,148 | B1 * | 5/2002 | Whitman | B41J 2/14129 204/192.15 |
| 8,384,064 | B2 * | 2/2013 | Akai | C09K 11/025 257/13 |

(Continued)

FOREIGN PATENT DOCUMENTS

| | | |
|---|---|---|
| JP | 2007-073656 A | 3/2007 |
| JP | 2008-034438 A | 2/2008 |
| JP | 2013-012735 A | 1/2013 |

*Primary Examiner* — Nikolay Yushin
(74) *Attorney, Agent, or Firm* — Fujitsu Patent Center

(57) ABSTRACT

A compound semiconductor device includes a first protection film which covers a surface of a compound semiconductor layer, where the first protection film is an insulating film whose major constituent is Si and at least one element between N and O, and a hydrophobic layer containing Si—$C_xH_y$ is formed at a surface thereof.

23 Claims, 15 Drawing Sheets

(51) Int. Cl.
*H03F 1/32* (2006.01)
*H03F 3/195* (2006.01)
H01L 23/31 (2006.01)
H02M 1/42 (2007.01)
H02M 3/337 (2006.01)

(56) References Cited

U.S. PATENT DOCUMENTS

| | | | | |
|---|---|---|---|---|
| 8,587,092 | B2* | 11/2013 | Makiyama | C23C 16/345 |
| | | | | 257/183 |
| 9,153,597 | B2* | 10/2015 | Kim | H01L 21/3105 |
| 9,219,172 | B2* | 12/2015 | Muller | H01L 51/5253 |
| 9,478,414 | B2* | 10/2016 | Kobayashi | H01L 21/0228 |
| 2008/0203541 | A1* | 8/2008 | Makiyama | C23C 16/345 |
| | | | | 257/640 |
| 2010/0237323 | A1* | 9/2010 | Akai | C09K 11/025 |
| | | | | 257/13 |
| 2012/0211762 | A1* | 8/2012 | Imada | H01L 23/49562 |
| | | | | 257/76 |
| 2012/0307534 | A1* | 12/2012 | Yamada | H01L 29/2003 |
| | | | | 363/123 |
| 2012/0319169 | A1 | 12/2012 | Hove | |
| 2013/0078776 | A1* | 3/2013 | Kim | H01L 21/3105 |
| | | | | 438/268 |
| 2014/0291658 | A1* | 10/2014 | Müller | H01L 51/5253 |
| | | | | 257/40 |
| 2016/0093485 | A1* | 3/2016 | Kobayashi | H01L 21/0228 |
| | | | | 438/763 |

* cited by examiner (a) BEFORE SILYLATION (b) AFTER SILYLATION

COMPOUND SEMICONDUCTOR DEVICE AND METHOD OF MANUFACTURING THE SAME

CROSS-REFERENCE TO RELATED APPLICATION

This application is based upon and claims the benefit of priority of the prior Japanese Patent Application No. 2015-032230, filed on Feb. 20, 2015, the entire contents of which are incorporated herein by reference.

FIELD

The embodiments discussed herein are directed to a compound semiconductor device and a method of manufacturing the same.

BACKGROUND

It has been studied to apply a nitride semiconductor to a high withstand voltage and high-power semiconductor device by using characteristics such as high saturation electron velocity and a wide band gap. For example, the band gap of GaN being the nitride semiconductor is 3.4 eV, and it is larger than the band gap of Si (1.1 eV) and the band gap of GaAs (1.4 eV), and has a high breakdown electric field intensity. Therefore, GaN is extremely expectable as a material of a semiconductor device for power supply use in high voltage operation and obtaining high-power.

As a semiconductor device using the nitride semiconductor, there are a lot of reports as for a field-effect transistor such as a high electron mobility transistor (HEMT). For example, as a GaN based HEMT (GaN-HEMT), an AlGaN/GaN.HEMT using GaN as an electron transit layer, and AlGaN as an electron supply layer has been focused. In the AlGaN/GaN-HEMT, distortion occurs at AlGaN due to a lattice constant difference between GaN and AlGaN. High concentration two-dimensional electron gas (2DEG) is obtained by a piezoelectric polarization and a spontaneous polarization of AlGaN which occur due to the distortion. Accordingly, it could be used as a high withstand electronic device such as a high efficiency switch element and an electric vehicle.

Related-art techniques are disclosed in Japanese Laid-open Patent Publication No. 2013-12735, Japanese Laid-open Patent Publication No. 2008-34438 and Japanese Laid-open Patent Publication No. 2007-73656.

However, in the GaN-HEMT, a current collapse phenomenon where current decrease due to voltage stress is often observed, and lowering of output has been seen as a problem. The current collapse phenomenon occurs because electrons which are accelerated by a strong electric field in a vicinity of a gate are captured by electron traps existing in a semiconductor crystal, at a semiconductor surface, and in a surface passivation film.

SUMMARY

An aspect of a compound semiconductor device includes: a compound semiconductor layer; and a first protection film which covers a surface of the compound semiconductor layer, wherein a hydrophobic layer containing Si—$C_xH_y$ is formed at a surface of the first protection film. As for the Si—$C_xH_y$, x>"0" (zero), y>"0" (zero), and $C_xH_y$ represents a substituent which contains C, H.

An aspect of a manufacturing method of a compound semiconductor device, includes: forming a compound semiconductor layer; forming a first protection film which covers a surface of the compound semiconductor layer; and forming a hydrophobic layer which contains Si—$C_xH_y$ at a surface of the first protection film by performing a silylation process for Si—OH existing at the surface of the first protection film by using a silane compound. As for the Si—$C_xH_y$, x>"0" (zero), y>"0" (zero), and $C_xH_y$ represents a substituent which contains C, H.

The object and advantages of the invention will be realized and attained by means of the elements and combinations particularly pointed out in the claims.

It is to be understood that both the foregoing general description and the following detailed description are exemplary and explanatory and are not restrictive of the invention.

DESCRIPTION OF EMBODIMENTS

First Embodiment

In the embodiment, an AlGaN/GaN.HEMT of a nitride semiconductor being one kind of a compound semiconductor is disclosed. In the embodiment, a configuration of the AlGaN/GaN.HEMT is described together with a manufacturing method thereof.

FIG. 1A to FIG. 3B are schematic sectional views each illustrating the manufacturing method of the AlGaN/GaN-.HEMT according to a first embodiment in process sequence.

Figure 1A:
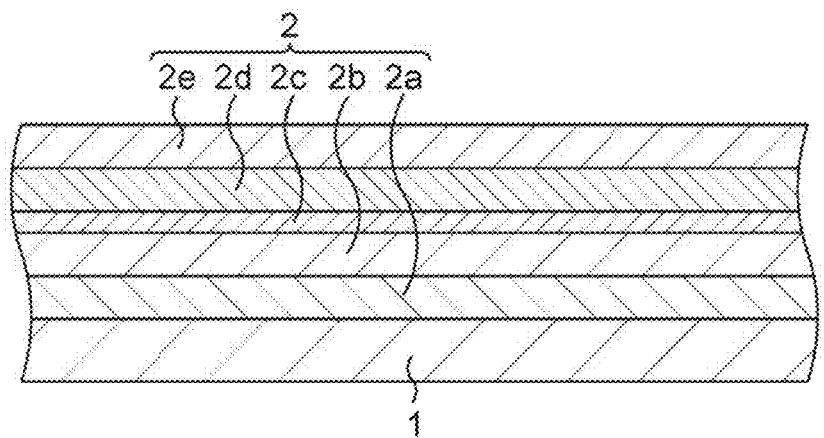
FIGS. 1A to 1C are schematic sectional views each illustrating a manufacturing method of an AlGaN/GaN-.HEMT according to a first embodiment in process sequence.

At first, as illustrated in FIG. 1A, a compound semiconductor stacked structure 2 is formed as a compound semiconductor layer on, for example, an Si substrate 1 as a growth substrate. As the growth substrate, an SiC substrate, a sapphire substrate, a GaAs substrate, a GaN substrate, and so on may be used instead of the Si substrate. Besides, as a conductivity of the substrate, it may have either semi-insulating or insulating property.

The compound semiconductor stacked structure 2 is made up by including a buffer layer 2a, an electron transit layer 2b, an intermediate layer 2c, an electron supply layer 2d, and a cap layer 2e.

In the completed AlGaN/GaN.HEMT, two-dimensional electron gas (2EDG) is generated in a vicinity of an interface of the electron transit layer 2b with the electron supply layer 2d (accurately, the intermediate layer 2c) at an operation time thereof. This 2DEG is generated based on a difference of lattice constants between the compound semiconductor (here, GaN) of the electron transit layer 2b and the compound semiconductor (here, AlGaN) of the electron supply layer 2d.

In detail, the following each compound semiconductor is grown by, for example, the metal organic vapor phase epitaxy (MOVPE) method on the Si substrate 1. The molecular beam epitaxy (MBE) method or the like may be used instead of the MOVPE method.

AlN is grown for a thickness of approximately 5 nm, i (intentionally undoped)-GaN is grown for a thickness of approximately 1 μm, i-AlGaN is grown for a thickness of approximately 5 nm, n-AlGaN is grown for a thickness of approximately 30 nm, n-GaN is grown for a thickness of approximately 3 nm, sequentially on the Si substrate 1. The buffer layer 2a, the electron transit layer 2b, the intermediate layer 2c, the electron supply layer 2d, and the cap layer 2e are thereby formed. As the buffer layer 2a, AlGaN may be used instead of AlN, or GaN may be grown by a low-temperature growth.

As a growth condition of AlN, mixed gas of trimethylaluminum (TMA) gas and ammonia ($NH_3$) gas is used as source gas. As a growth condition of GaN, mixed gas of trimethylgallium (TMG) gas and $NH_3$ gas is used as source gas. As a growth condition of AlGaN, mixed gas of TMA gas, TMG gas, and $NH_3$ gas is used as source gas. Presence and absence of supply and flow rate of trimethylaluminum gas being an Al source and trimethylgallium gas being a Ga source are appropriately set in accordance with the compound semiconductor layer to be grown. A flow rate of ammonia gas being a common source is set to be approximately 100 ccm to 10 LM. Besides, a growth pressure is approximately 50 Torr to 300 Torr, and a growth temperature is approximately 1000° C. to 1200° C.

When GaN, AlGaN are each grown as an n-type, for example, $SiH_4$ gas containing, for example, Si is added to the source gas at a predetermined flow rate as an n-type impurity to dope Si to GaN and AlGaN. A doping concentration of Si is approximately $1\times10^{18}/cm^3$ to approximately $1\times10^{20}/cm^3$, for example, it is set to be approximately $5\times10^{18}/cm^3$.

Figure 1B:
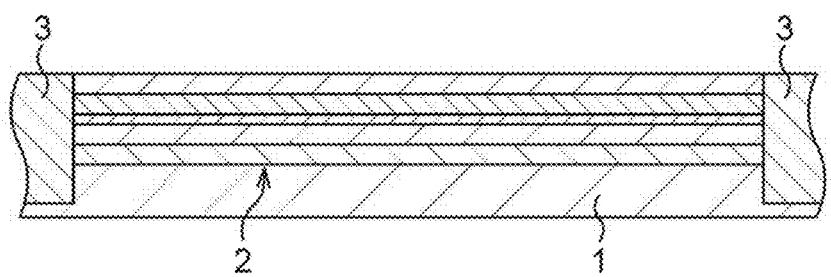

Subsequently, as illustrated in FIG. 1B, element isolation structures 3 are formed.

In detail, for example, argon (Ar) is injected to element isolation regions of the compound semiconductor stacked structure 2. The element isolation structures 3 are thereby formed at the compound semiconductor stacked structure 2 and a surface layer part of the Si substrate 1. Active regions are defined on the compound semiconductor stacked structure 2 by the element isolation structures 3.

Note that the element isolation may be performed by using, for example, the STI (shallow trench isolation) method instead of the above-stated injection method. At this time, for example, chlorine-based etching gas is used for the dry-etching of the compound semiconductor stacked structure 2.

Figure 1C:
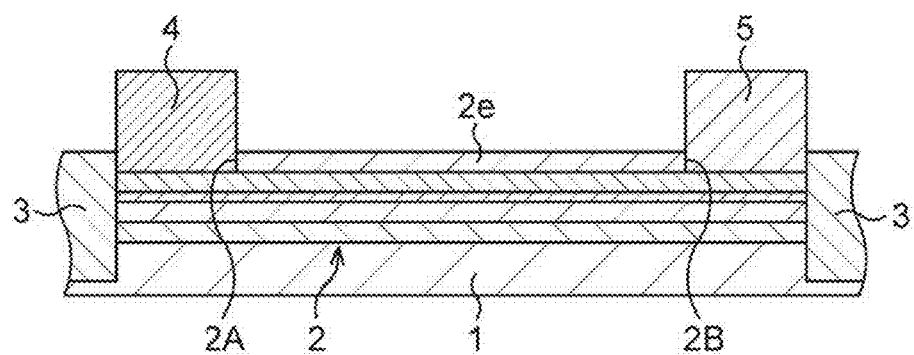

Subsequently, as illustrated in FIG. 1C, a source electrode 4 and a drain electrode 5 are formed.

In detail, at first, electrode recesses 2A, 2B are formed at formation planned positions of a source electrode and a drain electrode (electrode formation planned positions) at a surface of the compound semiconductor stacked structure 2.

A resist is coated on the surface of the compound semiconductor stacked structure 2. The resist is processed by the lithography to form openings which expose the surface of the compound semiconductor stacked structure 2 corresponding to the electrode formation planned positions at the resist. A resist mask having the openings is thereby formed.

The electrode formation planned positions of the cap layer 2e are dry-etched to be removed by using this resist mask until a surface of the electron supply layer 2d exposes. The electrode recesses 2A, 2B which expose the electrode formation planned positions at the surface of the electron supply layer 2d are thereby formed. As an etching condition, inert gas such as Ar and chlorine-based gas such as $Cl_2$ are used as etching gas, and for example, as for $Cl_2$, a flow rate is set to be 30 sccm, a pressure is set to be 2 Pa, and an RF input power is set to be 20 W. Note that the electrode recesses 2A, 2B may be formed by etching to a middle of the cap layer 2e or by etching beyond the electron supply layer 2d.

The resist mask is removed by the ashing treatment or the like.

A resist mask to form the source electrode and the drain electrode is formed. Here, for example, an eaves-structure two-layer resist which is suitable for the vapor deposition method and the lift-off method is used. This resist is coated on the compound semiconductor stacked structure 2, and openings exposing the electrode recesses 2A, 2B are formed. The resist mask having the openings is thereby formed.

For example, Ta/Al are deposited as electrode materials on the resist mask including in the openings which expose the electrode recesses 2A, 2B by using this resist mask by, for example, the vapor deposition method. A thickness of Ta is set to be approximately 20 nm, and a thickness of Al is set to be approximately 200 nm. The resist mask and Ta/Al deposited thereon are removed by the lift-off method. After that, the Si substrate 1 is heat-treated in, for example, a nitrogen atmosphere at a temperature of approximately 400° C. to 1000° C., for example, at approximately 600° C., and remaining Ta/Al are brought into ohmic-contact with the electron supply layer 2d. There is a case when the heat treatment is not necessary as long as the ohmic-contact between Ta/Al and the electron supply layer 2d is obtained. The source electrode 4 and the drain electrode 5 in which the electrode recesses 2A, 2B are embedded by a part of the electrode materials are thereby formed.

Figure 2A:
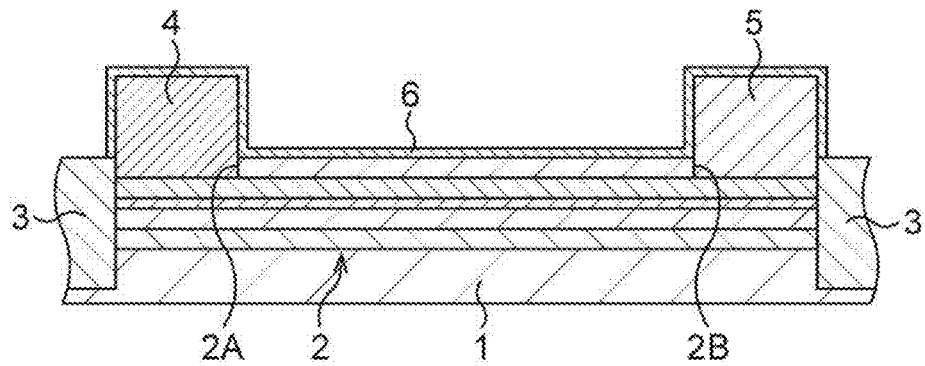
FIGS. 2A to 2C are schematic sectional views each illustrating the manufacturing method of the AlGaN/GaN-.HEMT according to the first embodiment subsequent to FIG. 1C in process sequence.

Subsequently, as illustrated in FIG. 2A, a first protection film 6 is formed.

In detail, at first, an insulating material is deposited on the compound semiconductor stacked structure 2. The insulating material is one whose major constituent is Si and at least one element between N and O. Specifically, SiN, SiO or SiON is deposited to be a single layer, or to be two layers or more selected therefrom. As the insulating material, SiC may be deposited to be the single layer. In the embodiment, for example, SiN is deposited to be the single layer as the insulating material. SiN is deposited for a thickness of approximately 10 nm to 100 m, here for the thickness of approximately 40 nm by, for example, the plasma CVD method.

The first protection film 6 made up of SiN which protects the surface of the compound semiconductor stacked structure 2 is thereby formed.

Figure 2B:
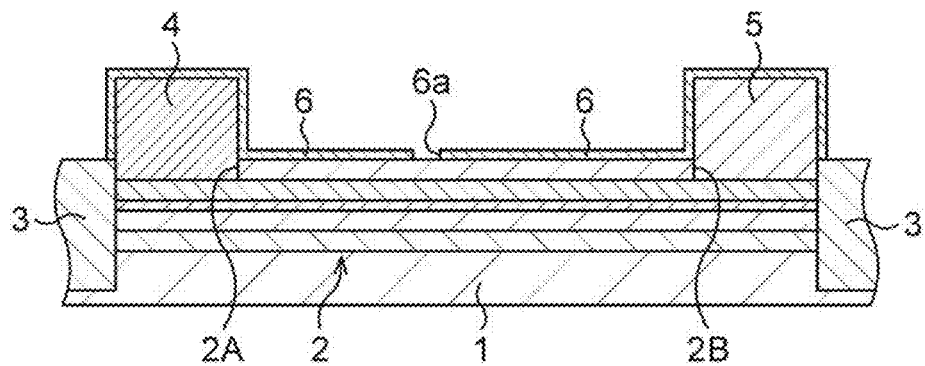

Subsequently, as illustrated in FIG. 2B, an opening 6a is formed at the first protection film 6.

In detail, the first protection film 6 is processed by the lithography and the dry-etching. The opening 6a exposing a part of the surface of the compound semiconductor stacked structure 2 is thereby formed at the first protection film 6.

The resist mask used for the dry-etching is removed by the ashing treatment or the like.

Figure 2C:
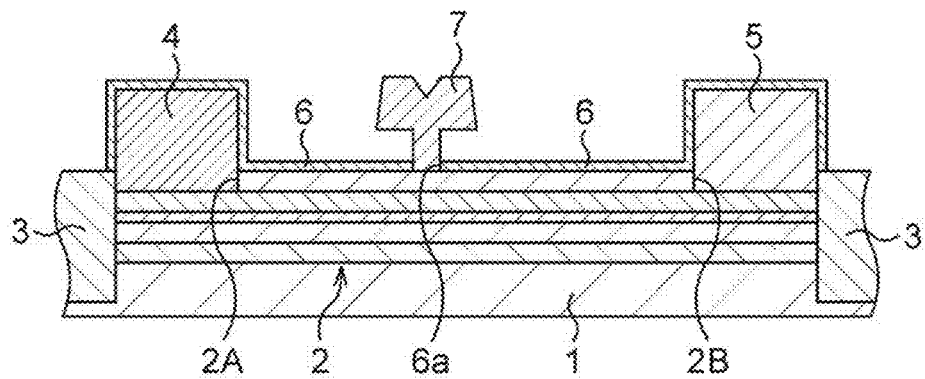

Subsequently, as illustrated in FIG. 2C, a gate electrode 7 is formed.

In detail, at first, a fine gate resist pattern, a lower layer resist pattern, and an upper layer resist pattern are formed on the first protection film 6. At the fine gate resist pattern, the opening 6a is formed at a region where a stipe part of a gate electrode which is a mushroom type in cross section is to be formed. At the lower resist pattern, an opening is formed at a region where a pileus part (over gate part) of the gate electrode is to be formed. At the upper layer resist pattern, an opening which is narrower than the opening of the lower layer resist pattern is formed.

When the fine gate resist pattern, the lower layer resist pattern, and the upper layer resist pattern are formed, at first, a polymethylmethacrylate resin (PMMA) (for example, manufactured by Microchem Corp., U.S.) is coated by, for example, the spin coating method, and the heat treatment is performed to thereby form a resist film. Next, polymethylglutarimide (PMGI) (for example, manufactured by Mirochem Corp., U.S.) is coated by, for example, the spin coating method, and the heat treatment is performed to thereby form a resist film. After that, a positive electron beam resist medium (for example, bland name ZEP520: manufactured by ZEON corporation) is coated by, for example, the spin coating method, and the heat treatment is performed to thereby form a resist film. Subsequently, the opening is formed at an upper layer resist film by the electron beam lithography method. As a result, the upper layer resist pattern including the opening is obtained. Next, the resist mask below the upper layer resist pattern is wet-etched by using an alkaline developing solution while using the upper layer resist pattern as a mask. As a result, the lower layer resist pattern including the opening is obtained. A multilayer resist in an eaves structure is obtained by these processes. Further, the resist film positioning at a lowermost position is processed by the electron beam lithography to thereby form an opening. As a result, the fine gate resist pattern including the opening is obtained.

After the fine gate resist pattern, the lower layer resist pattern, and the upper layer resist pattern are formed, the gate electrode 7 is formed in each of the openings communicated with each other. When the gate electrode 7 is formed, for example, an Ni layer is formed by the vapor deposition method, and an Au layer is formed thereon by the vapor deposition method. A thickness of the Ni layer is approximately 10 nm, and a thickness of the Au layer is approximately 300 nm.

The fine gate resist pattern, the lower layer resist pattern, and the upper layer resist pattern are removed by using a warmed organic solvent together with a gate electrode material deposited on the upper layer resist pattern.

The gate electrode 7 is an electrode whose cross section in a gate length direction is the mushroom type, and an upper part (over gate part) and a lower part (fine gate part) which is narrower than the upper part are integrally formed. A lower part of the fine gate part of the gate electrode 7 embeds in the opening 6a of the first protection film 6 to be in schottky contact with the compound semiconductor stacked structure 2, and a lower surface of the over gate part is separated from the surface of the compound semiconductor stacked structure 2.

Figure 3A:
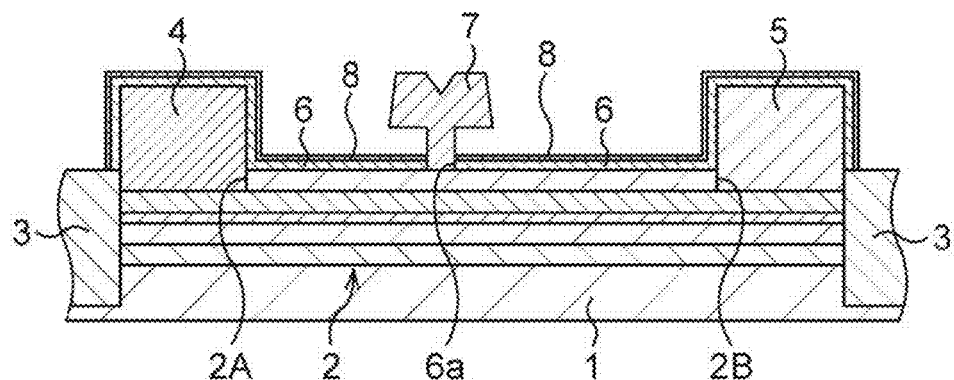
FIGS. 3A, 3B are schematic sectional views each illustrating the manufacturing method of the AlGaN/GaN-HEMT according to the first embodiment subsequent to FIG. 2C in process sequence.

Subsequently, as illustrated in FIG. 3A, a hydrophobic layer 8 is formed at a surface of the first protection film 6.

The surface of the first protection film 6 is activated when it is exposed to plasma by the ashing treatment at the resist peeling process when the opening 6a is formed, and by the preprocessing of the vapor deposition of the electrode material at the forming process of the gate electrode 7, and so on and reacts with moisture in the atmosphere. An Si—OH layer is thereby generated at the surface of the first protection film 6 to be a thickness of, for example, approximately several nm, exceedingly approximately 10 nm. In the embodiment, the hydrophobic layer 8 is formed at the surface of the first protection film 6, namely, at a surface layer of the Si—OH layer to suppress the current collapse resulting from the Si—OH layer and adsorbed water which is bound to the hydroxyl group (—OH).

In detail, the surface layer of the Si—OH layer is silylated by using a silane compound. As the silane compound, it is possible to use any one kind or by combining two kinds or more from among dimethylethoxysilane, hexamethyldisilazane, tetramethyldisilazane, dimethylaminotrimethylsilane, dimethylaminodimethylsilane, bis(dimethylamino)dimethylsilane, bis(diethylamino)dimethylsilane, and tris(dimethylamino)methylsilane. Here, for example, hexamethyldisilazane is used.

In the embodiment, the surface layer of the Si—OH layer is silylated by using a vapor state hexamethyldisilazane. The vapor state silane compound is easy to be permeated into the Si—OH layer, and the Si—OH layer is silylated as much as possible. A liquid state silane compound may be used instead of the vapor state silane compound, to be coated at the surface of the first protection film 6 by, for example, the spin coating method.

A process temperature at the silylation time is preferably 90° C. to 200° C., and here, the surface of the Si—OH layer is silylated at the process temperature of 100° C. The hydrophobic layer 8 containing Si—$C_xH_y$ is thereby formed at the surface layer of the Si—OH layer for a thickness of approximately 1 nm to 10 nm, in the embodiment, for the thickness of approximately 5 nm. Here, as for the Si—$C_xH_y$, x>"0" (zero), y>"0" (zero), and $C_xH_y$ represents a substituent which contains C, H, and in the embodiment, for example, it is a methyl group (—$CH_3$) where x=1, y=3. At the first protection film 6, a carbon concentration at the hydrophobic layer 8 is higher than the carbon concentration at an SiN part other than the hydrophobic layer 8.

The Si—OH layer is the polar group, and therefore, when it is formed at the first protection film 6, SiN is hydrophilized and the water adsorption proceeds. In the embodiment, the hydrophobic layer 8 is formed at least at the surface layer of the Si—OH layer, in other words, at least a part of the Si—OH layer is replaced by Si—$C_xH_y$, and thereby, the water repellency of the surface of the first protection film 6 recovers, and the current collapse is suppressed.

Note that when the thickness of the Si—OH layer which is generated at the surface of the first protection film 6 is relatively thin (approximately several nm), there is a case when the hydrophobic layer 8 containing Si—$C_xH_y$ is formed by almost all of the Si—OH layer which is silylated by the silylation process of the surface of the first protection film 6. In this case, the hydrophobic layer 8 is formed without remaining the Si—OH layer at the surface layer of the SiN first protection film 6. The water repellency of the surface of the first protection film 6 improves by this constitution as much as possible, and the current collapse is more certainly suppressed.

Figure 3B:
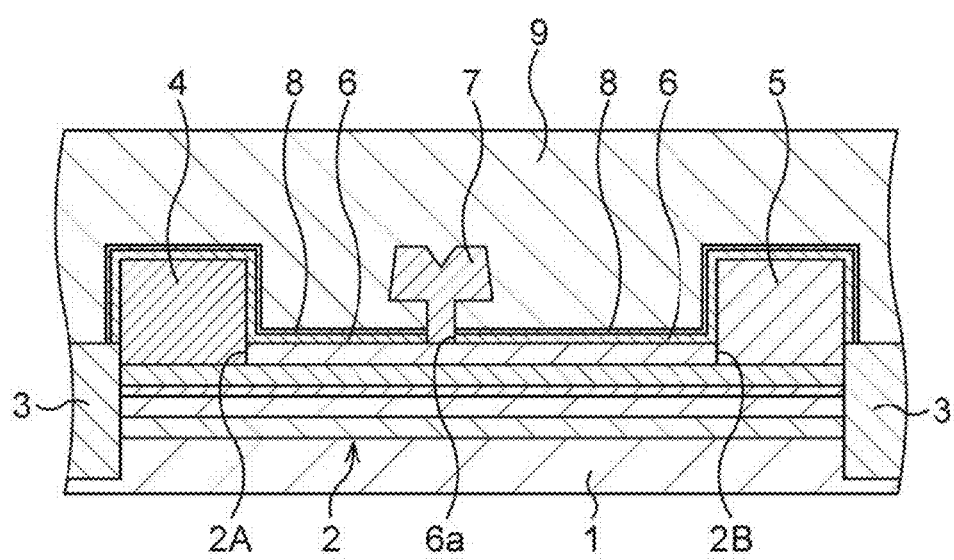

Subsequently, as illustrated in FIG. 3B, a second protection film 9 is formed.

In detail, an insulating material is formed on the first protection film 6 so as to cover the source electrode 4, the drain electrode 5, and the gate electrode 7. As the insulating material, one whose density is smaller and dielectric density is lower than the insulating material of the first protection film 6, for example, SiN, SiON, or SiOC is used. In the embodiment, for example, SiON is used as the insulating material, it is coated by the spin coating method to form the second protection film 9. The second protection film 9 is formed on the first protection film 6, and thereby, further moisture resistance is secured, and high-frequency characteristics improve.

After that, contact holes which expose surfaces of the source electrode 4, the drain electrode 5 are formed at the second protection film 9 and the first protection film 6, and a contact hole which exposes a surface of the gate electrode 7 is formed at the second protection film 9. The AlGaN/GaN.HEMT according to the embodiment is formed by going through various processes such as formation of wirings to be connected to these electrodes.

Hereinafter, effects of the embodiment are verified by performing evaluations before and after the silylation process of the first protection film 6 in the embodiment.

Figure 4A:
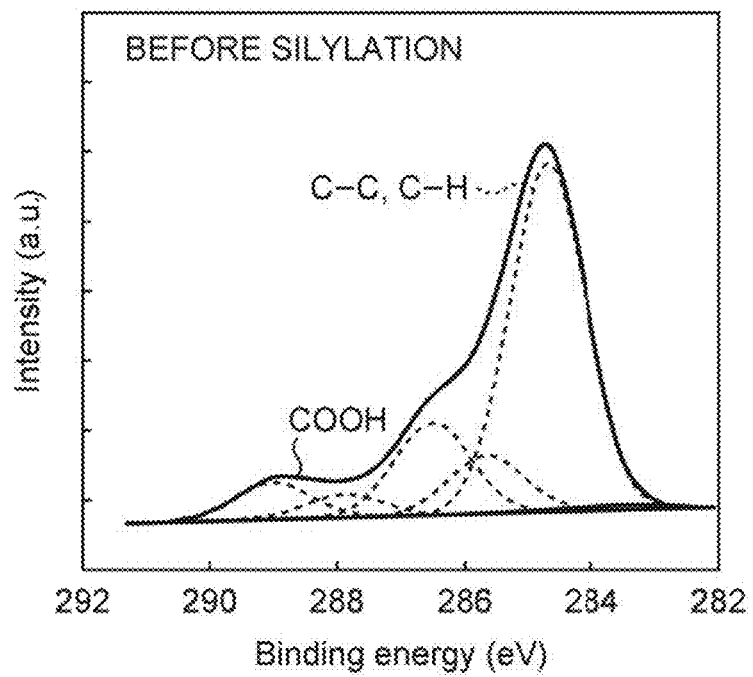
FIGS. 4A, 4B are characteristic diagrams each illustrating a result of analysis of a surface of a first protection film by an XPS in the first embodiment.
Figure 4B:
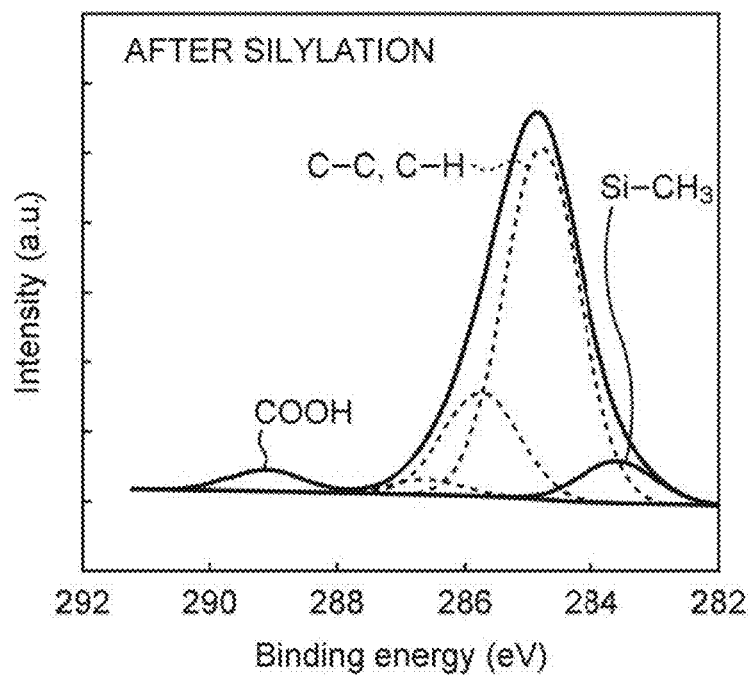

At first, the surface of the first protection film 6 is analyzed by the X-ray photoelectron spectroscopy (XPS). Results thereof are illustrated in FIGS. 4A, 4B. A relationship between binding energy and intensity is illustrated as for each of before the silylation process in FIG. 4A and after the silylation process in FIG. 4B. It was verified from this result that generation of Si—$CH_3$ was observed and the hydrophobic layer 8 containing Si—$C_xH_y$ was formed at the surface of the first protection film 6 by the silylation process using hexamethyldisilazane.

Figure 5A:
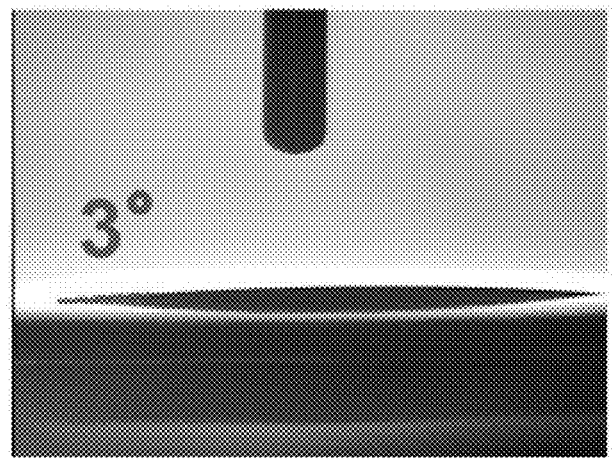
FIGS. 5A, 5B are views of photographs each illustrating wettability at the surface of the first protection film in the first embodiment.
Figure 5B:
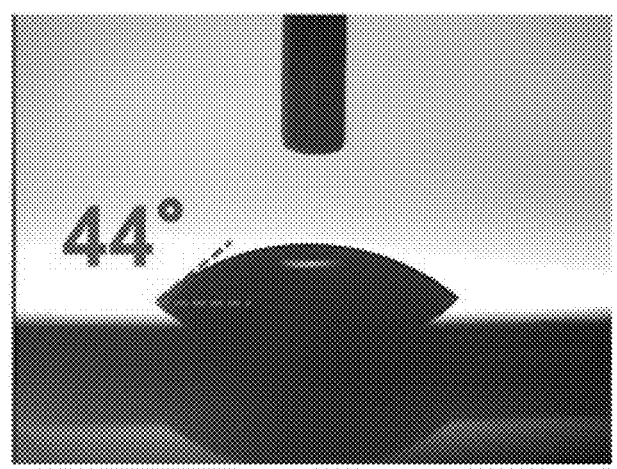

Next, wettability for water in each before and after the silylation process is examined as for the surface of the first protection film 6. Results thereof are illustrated in FIGS. 5A, 5B. An appearance in which water is dropped from a nozzle to the surface of the first protection film 6 is illustrated as for each of before the silylation process in FIG. 5A and after the silylation process in FIG. 5B. Contact angles of water with the surface of the first protection film 6 were 3° before the silylation process, and 44° after the silylation process. It was verified from this result that the contact angle of water relative to the surface of the first protection film 6 was improved by the silylation process, and the water adsorption was suppressed in addition to the reduction of Si—OH.

Figure 6A:
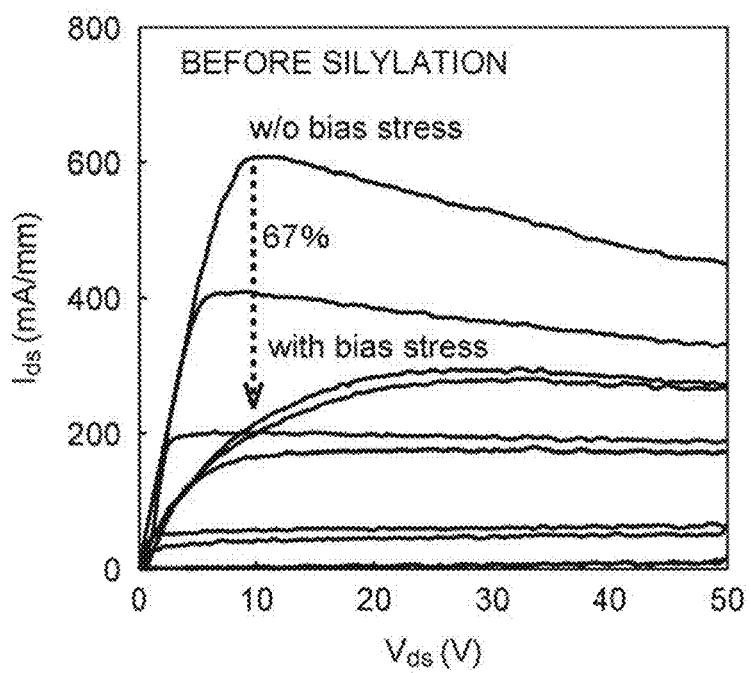
FIGS. 6A, 6B are characteristic diagrams each illustrating an evaluation result of a current collapse in the first embodiment.
Figure 6B:
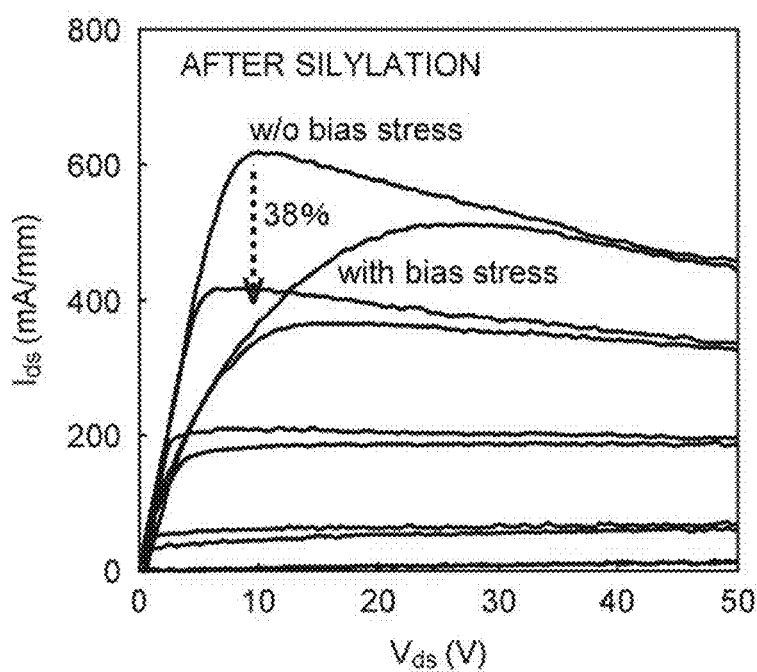

Based on the two kinds of experimental results, the current collapses before and after the silylation process are examined. Results thereof are illustrated in FIGS. 6A, 6B. Measured $I_{ds}$-$V_{ds}$ characteristics are respectively illustrated as for before the silylation process in FIG. 6A, and after the silylation process in FIG. 6B. Current degradation resulting from bias stress ($V_{gs}$=–3 V, $V_{ds}$=30 V) is suppressed from 67% before the silylation process to 38% after the silylation process, and it becomes obvious that the current collapse is reduced by the silylation process.

As described hereinabove, according to the embodiment, it is possible to enable the AlGaN/GaN.HEMT with high reliability and high withstand voltage which reduces the hydroxyl group (—OH) and the adsorbed water bound to the hydroxyl group in the first protection film 6, and suppresses the current collapse.

Modification Example

Hereinafter, a modification example of the first embodiment is described. In the example, a configuration and a manufacturing method of an AlGaN/GaN.HEMT are disclosed as same as the first embodiment, but they are different in a point that a time point of the silylation process of the first protection film is different. Note that the same reference numerals are supplied as for the same components or the like as the first embodiment, and detailed descriptions are not given.

Figure 7A:
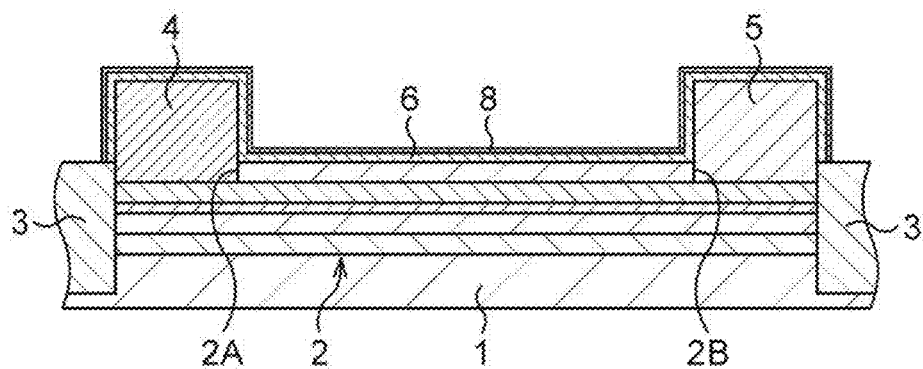
FIGS. 7A, 7B are schematic sectional views each illustrating a major process of a manufacturing method of an AlGaN/GaN.HEMT according to a modification example of the first embodiment.
Figure 7B:
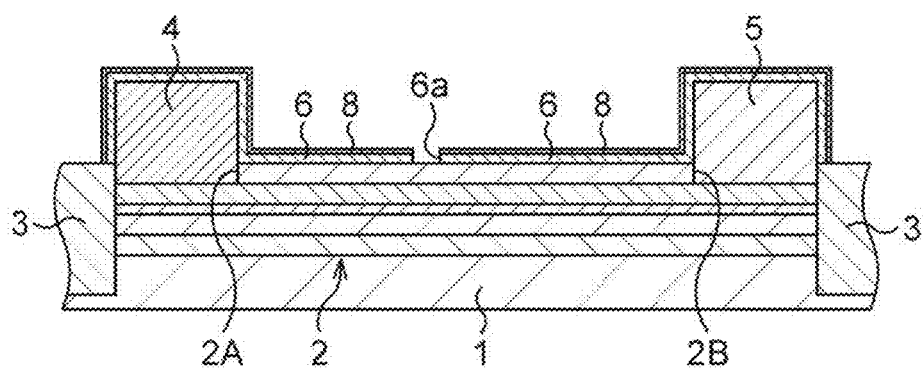

FIGS. 7A, 7B are schematic sectional views each illustrating a major process of the manufacturing method of the AlGaN/GaN.HEMT according to the modification example of the first embodiment.

In the example, at first, various processes of FIG. 1A to FIG. 2A are gone through as same as the first embodiment. At this time, the first protection film 6 is formed on the compound semiconductor stacked structure 2.

Subsequently, as illustrated in FIG. 7A, the hydrophobic layer 8 is formed at the surface of the first protection film 6. The surface of the first protection film 6 is silylated under the various conditions similar to the first embodiment. The hydrophobic layer 8 containing Si—$C_xH_y$ is thereby formed at the surface layer of the Si—OH layer generated at the surface of the first protection film 6.

Subsequently, as illustrated in FIG. 7B, the opening 6a is formed at the silylated first protection film 6.

In detail, the silylated first protection film 6 is processed by the lithography and the dry-etching. The opening 6a which exposes a part of the surface of the compound semiconductor stacked structure 2 is thereby formed at the first protection film 6.

A resist mask used for the dry-etching is removed by the ashing treatment or the like.

Subsequently, as same as FIG. 3A of the first embodiment, the gate electrode 7 is formed.

In detail, the gate electrode 7 whose cross section in the gate length direction is the mushroom type, and which is made up by integrally forming the upper part (over gate part)

and the lower part (fine gate part) which is narrower than the upper part is formed as same as the first embodiment.

In the example, a whole surface of the first protection film 6 is silylated before the etching process under a state when the first protection film 6 is formed at a whole surface on the compound semiconductor stacked structure 2. Accordingly, the hydrophobic layer 8 is formed almost evenly at the whole surface of the first protection film 6, and it contributes to a certain suppression of the current collapse by showing enough water repellency.

Besides, a temperature required when the gate electrode 7 is formed is 400° C. or less at the most, and there is no worry in which the hydrophobic layer 8 formed at the surface of the first protection film 6 is deteriorated.

Subsequently, the second protection film 9 is formed as same as FIG. 3B of the first embodiment.

In detail, for example, SiON is coated on the first protection film 6 so as to cover the source electrode 4, the drain electrode 5, and the gate electrode 7 by the spin coating method as same as the first embodiment. The second protection film 9 is thereby formed.

After that, contact holes which expose the surfaces of the source electrode 4, the drain electrode 5 are formed at the second protection film 9 and the first protection film 6, and a contact hole which exposes the surface of the gate electrode 7 is formed at the second protection film 9. The AlGaN/GaN.HEMT according to the embodiment is formed by going through various processes such as the formation of the wirings to be connected to these electrodes.

As described hereinabove, according to the example, it is possible to enable the AlGaN/GaN.HEMT with high reliability and high withstand voltage which reduces the hydroxyl group (—OH) in the first protection film 6 and the adsorbed water bound to the hydroxyl group, and suppresses the current collapse.

Second Embodiment

In the embodiment, a configuration and a manufacturing method of an AlGaN/GaN.HEMT are disclosed as same as the first embodiment, but they are different in a point that a constitution of the first protection film is different. Note that the same reference numerals are supplied as for the same components or the like as the first embodiment, and detailed descriptions are not given.

FIGS. 8A to 8C, FIGS. 9A, 9B are schematic sectional views each illustrating a major process of the manufacturing method of the AlGaN/GaN.HEMT according to a second embodiment.

In the embodiment, at first, the various processes of FIG. 1A to FIG. 1C are gone through as same as the first embodiment. At this time, the source electrode 4 and the drain electrode 5 are formed on the compound semiconductor stacked structure 2.

Figure 8A:
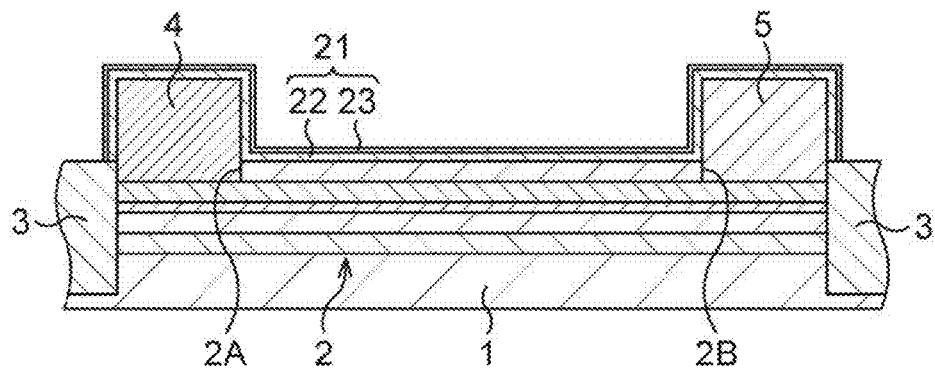
FIGS. 8A to 8C are schematic sectional views each illustrating a major process of a manufacturing method of an AlGaN/GaN.HEMT according to a second embodiment.

Subsequently, as illustrated in FIG. 8A, a first protection film 21 is formed.

In detail, at first, a first insulating material is deposited on the compound semiconductor stacked structure 2. The first insulating material is one whose major constituent is Si and at least one element between N and O. Specifically, SiN, SiO or SiON is deposited to be a single layer, or two layers or more selected therefrom. In the embodiment, for example, SiN is deposited to be the single layer as the first insulating material. SiN is deposited for a thickness of approximately 10 nm to 100 nm, here for the thickness of approximately 40 nm by, for example, the plasma CVD method. A lower layer protection film 22 made up of SiN is thereby formed.

Next, a second insulating material is deposited on the lower layer protection film 22. The second insulating material is SiC, and it is deposited for a thickness of approximately 10 nm to 100 nm, here for the thickness of approximately 20 nm by the CVD method. An upper layer protection film 23 made up of SiC is thereby formed. Hereinabove, the first protection film 21 made up of the upper layer protection film 23 stacked on the lower layer protection film 22 is formed.

Figure 8B:
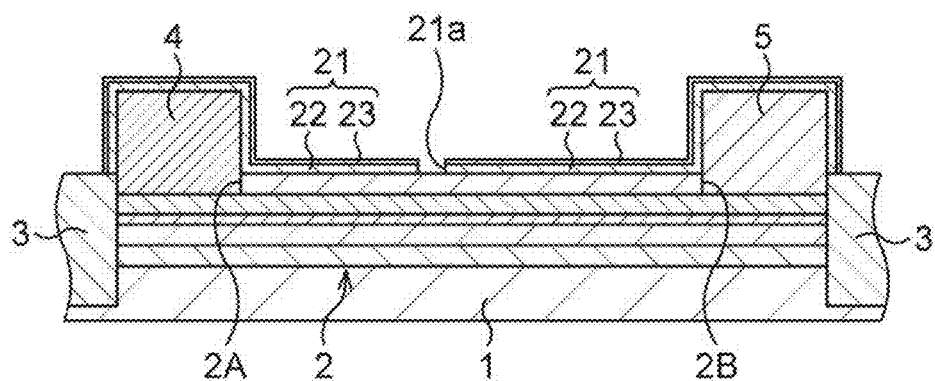

Subsequently, as illustrated in FIG. 8B, an opening 21a is formed at the first protection film 21.

In detail, the first protection film 21 is processed by the lithography and the dry-etching. The opening 21a which exposes a part of the surface of the compound semiconductor stacked structure 2 is thereby formed at the first protection film 21.

A resist mask used for the dry-etching is removed by the ashing treatment or the like.

Figure 8C:
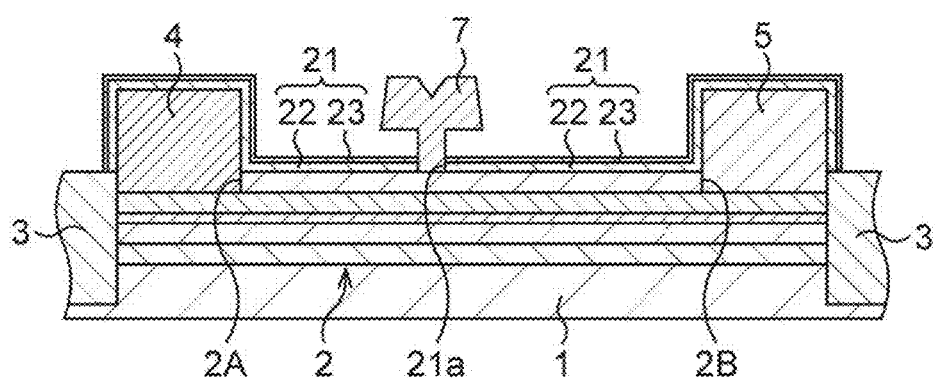

Subsequently, as illustrated in FIG. 8C, the gate electrode 7 is formed.

In detail, the gate electrode 7 whose cross section in the gate length direction is the mushroom type, and which is made up by integrally forming the upper part (over gate part) and the lower part (fine gate part) which is narrower than the upper part is formed as same as the first embodiment.

Figure 9A:
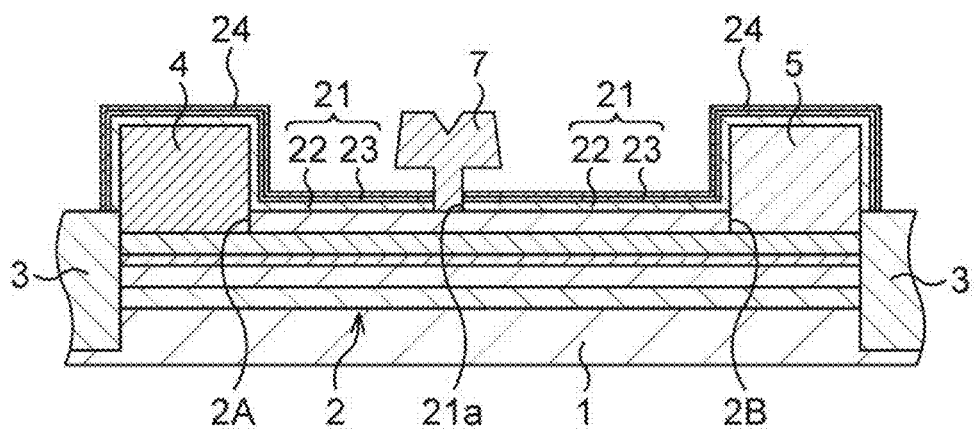
FIGS. 9A, 9B are schematic sectional views each illustrating the major process of the manufacturing method of the AlGaN/GaN.HEMT according to the second embodiment subsequent to FIG. 8C.

Subsequently, as illustrated in FIG. 9A, a hydrophobic layer 24 is formed at a surface of the first protection film 21.

The surface of the first protection film 21, namely, a surface of the SiC upper layer protection film 23 is silylated under the various conditions similar to the first embodiment. The hydrophobic layer 24 containing Si—$C_xH_y$ is thereby formed at a surface layer of the upper layer protection film 23.

In the embodiment, the first protection film 21 is formed to be a stacked structure where the SiC upper layer protection film 23 is deposited on the SiN lower layer protection film 22. The upper layer protection film 23 is SiC, therefore, the hydrophobic layer 24 containing Si—$C_xH_y$ is formed at the surface layer thereof, and thereby, the first protection film 21 becomes an insulating film further excellent in water repellency, and the suppression of the current collapse becomes obvious.

Figure 9B:
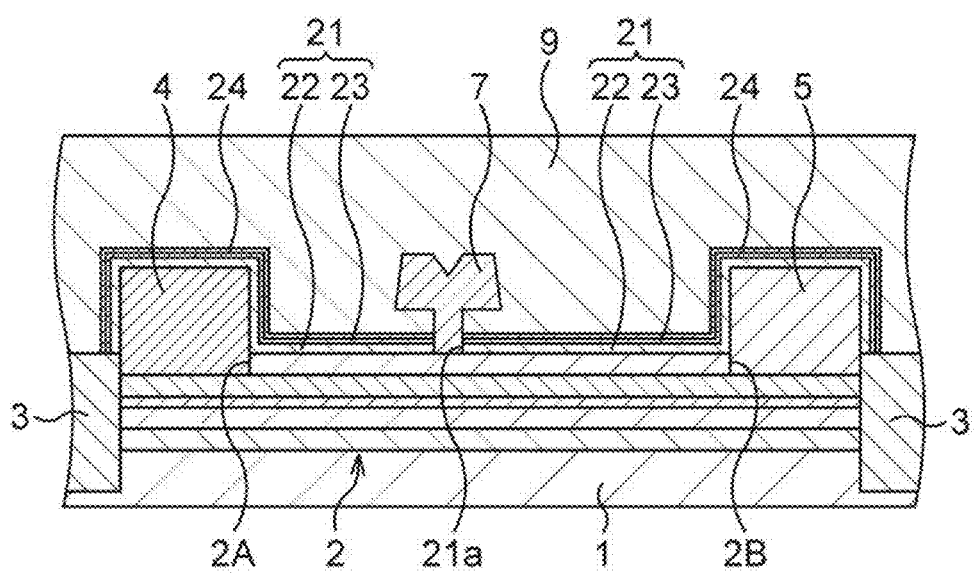

Subsequently, as illustrated in FIG. 9B, the second protection film 9 is formed.

In detail, for example, SiON is coated on the first protection film 21 by the spin coating method so as to cover the source electrode 4, the drain electrode 5, and the gate electrode 7 as same as the first embodiment. The second protection film 9 is thereby formed.

After that, contact holes which expose the surfaces of the source electrode 4, the drain electrode 5 are formed at the second protection film 9 and the first protection film 21, and a contact hole which exposes the surface of the gate electrode 7 is formed at the second protection film 9. The AlGaN/GaN.HEMT according to the embodiment is formed by going through the various processes such as the formation of the wirings to be connected to these electrodes.

As described hereinabove, according to the embodiment, it is possible to enable the AlGaN/GaN.HEMT with high reliability and high withstand voltage which suppresses the current collapse by securing the water repellency of the first protection film 21.

Third Embodiment

In the embodiment, a configuration and a manufacturing method of an AlGaN/GaN.HEMT are disclosed as same as the first embodiment, but they are different in a point that a constitution of the first protection film is different. Note that the same reference numerals are supplied as for the same components or the like as the first embodiment, and detailed descriptions are not given.

FIGS. 10A to 10C, FIGS. 11A, 11B are schematic sectional views each illustrating a major process of the manufacturing method of the AlGaN/GaN.HEMT according to a third embodiment.

In the embodiment, at first, the various processes in FIG. 1A to FIG. 1C are gone through as same as the first embodiment. At this time, the source electrode 4 and the drain electrode 5 are formed on the compound semiconductor stacked structure 2.

Figure 10A:
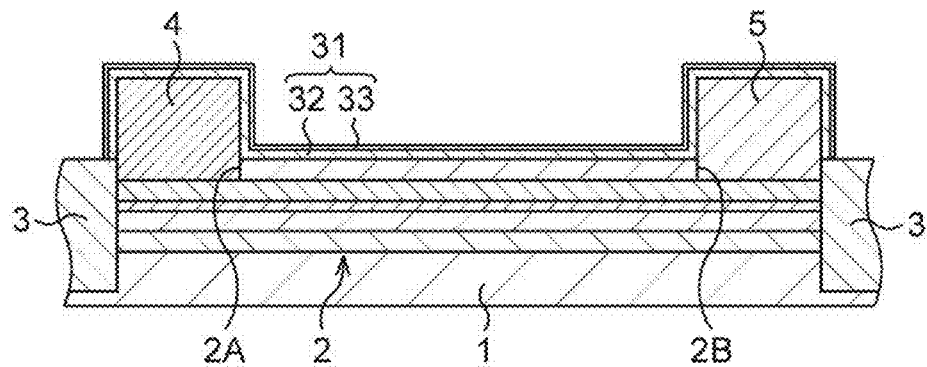
FIGS. 10A to 10C are schematic sectional views each illustrating a major process of a manufacturing method of an AlGaN/GaN.HEMT according to a third embodiment.

Subsequently, as illustrated in FIG. 10A, a first protection film 31 is formed.

In detail, at first, a first insulating material is deposited on the compound semiconductor stacked structure 2. The first insulating material is SiN, and it is deposited for a thickness of approximately 10 nm to 100 nm, here for the thickness of approximately 40 nm, by the plasma CVD method.

Next, the deposited SiN is heat-treated at, for example, approximately 600° C. In this SiN, bonding of Si—N is accelerated, and it becomes $Si_3N_4$ (SiN whose composition ratio between Si and N is 3:4) in a stoichiometry state where defects such as dangling bond seldom exists. This $Si_3N_4$ has a dielectric constant of approximately 7.0 to 7.3. Besides, this $Si_3N_4$ has an electric capacity of approximately 15.5 pF to approximately 16.2 pF when it is converted with a film thickness of 40 nm, an area of 10000 µm². A lower layer protection film 32 made up of $Si_3N_4$ in the stoichiometry state covering the surface of the compound semiconductor stacked structure 2 is thereby formed.

Next, a second insulating material is deposited on the lower layer protection film 32. The second insulating material is SiN, and it is formed by the plasma CVD method while making an amount of $N_2$ being source gas of N larger than that of a case of the formation of the lower layer protection film 32, or making an amount of $SiH_4$ being source gas of Si larger than that of the case of the formation of the lower layer protection film 32. This SiN is deposited for a thickness of approximately 10 nm to 100 nm, here for the thickness of approximately 20 nm. SiN is thereby formed as SiN in a non-stoichiometry state where defects such as the dangling bond exists and whose composition ratio is different from the lower layer protection film 32 (SiN whose composition ratio between Si and N is not 3:4). This SiN has the dielectric constant at a value larger than approximately 7.0 and smaller than approximately 7.3. An upper layer protection film 33 made up of SiN in the non-stoichiometry state is thereby formed on the lower layer protection film 32. A stacked structure of the lower layer protection film 32 and the upper layer protection film 33 becomes the first protection film 31.

Figure 10B:
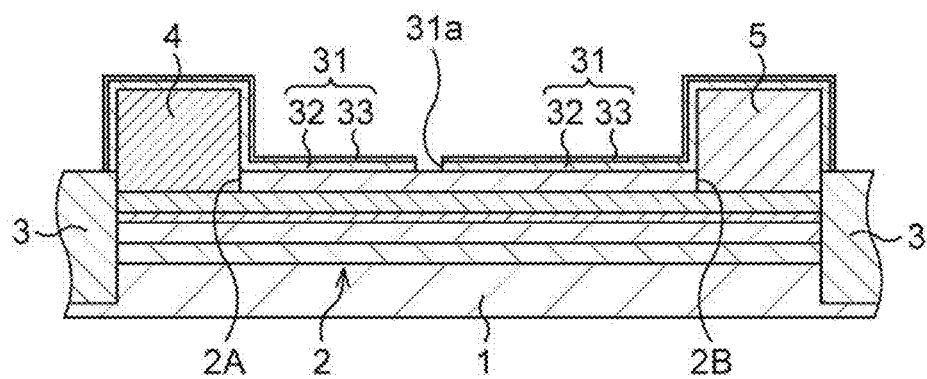

Subsequently, as illustrated in FIG. 10B, an opening 31a is formed at the first protection film 31.

In detail, the first protection film 31 is processed by the lithography and the dry-etching. The opening 31a which exposes a part of the surface of the compound semiconductor stacked structure 2 is thereby formed at the first protection film 31.

A resist mask used for the dry-etching is removed by the ashing treatment or the like.

Figure 10C:
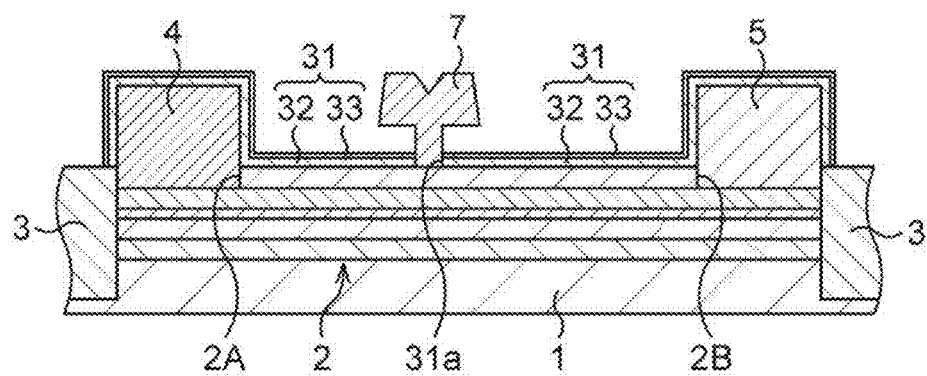

Subsequently, as illustrated in FIG. 10C, the gate electrode 7 is formed.

In detail, the gate electrode 7 whose cross section in the gate length direction is the mushroom type, and which is made up by integrally forming the upper part (over gate part) and the lower part (fine gate part) which is narrower than the upper part is formed as same as the first embodiment.

Figure 11A:
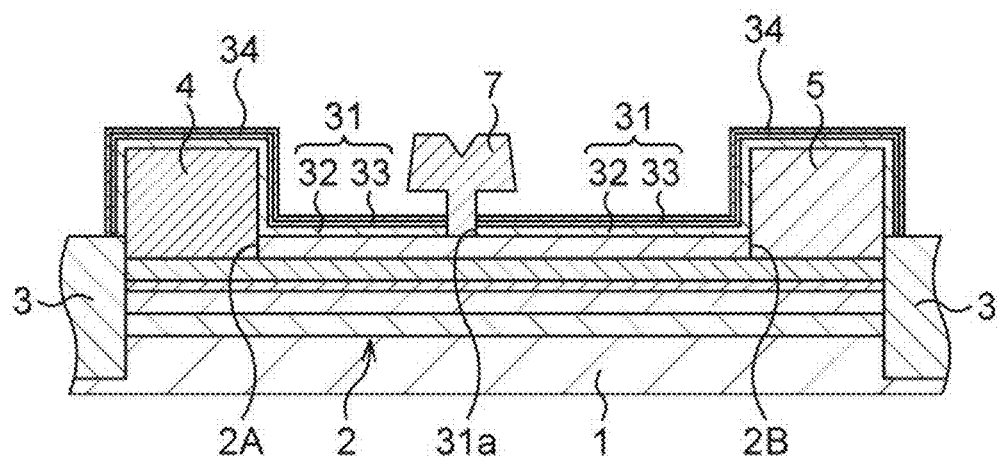
FIGS. 11A, 11B are schematic sectional views each illustrating the major process of the manufacturing method of the AlGaN/GaN.HEMT according to the third embodiment subsequent to FIG. 10C.

Subsequently, as illustrated in FIG. 11A, a hydrophobic layer 34 is formed at a surface of the first protection film 31.

The surface of the first protection film 31, namely, a surface of the upper layer protection film 33 made up of SiN in the non-stoichiometry state is silylated under the various conditions similar to the first embodiment. The hydrophobic layer 34 containing Si—$C_xH_y$ is thereby formed at a surface layer of the upper layer protection film 33.

In the embodiment, the first protection film 31 is formed to be a stacked structure where the upper layer protection film 33 made up of SiN in the non-stoichiometry state is deposited on the lower layer protection film 32 made up of SiN in the stoichiometry state. The surface of the compound semiconductor stacked structure 2 including on the source electrode 4 and on the drain electrode 5 is covered by the lower layer protection film 32, and thereby, a fine electron transportation is obtained among the drain electrode 5, the gate electrode 7, and the source electrode 4. The upper layer protection film 33 is SiN in the non-stoichiometry state, and therefore, it contains Si—H and has a hydrophobicity. The hydrophobic layer 34 containing Si—$C_xH_y$ is formed at the surface layer thereof, and thereby, the first protection film 31 becomes an insulating film further excellent in the water repellency, and the suppression of the current collapse becomes obvious.

Figure 11B:
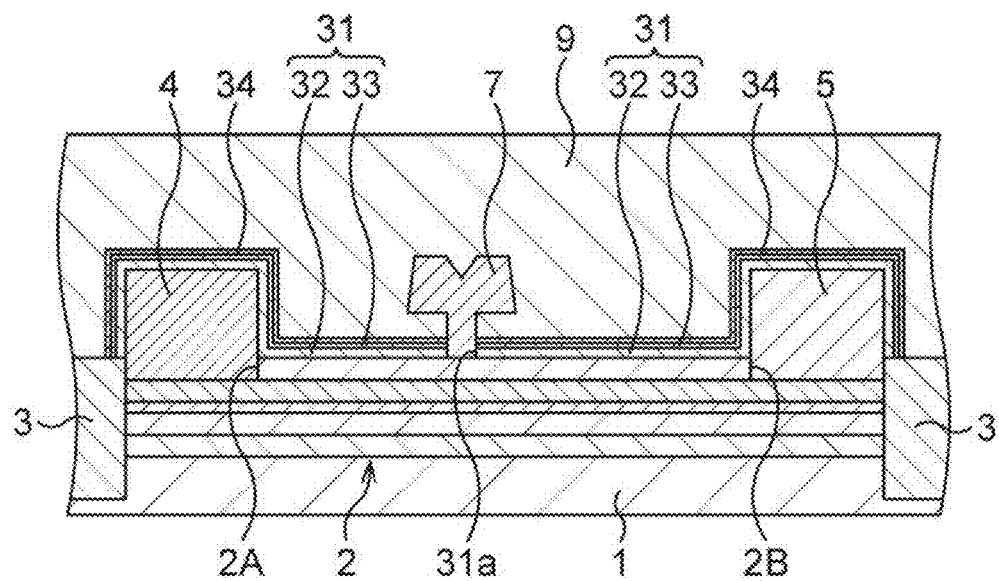

Subsequently, as illustrated in FIG. 11B, the second protection film 9 is formed.

In detail, for example, SiON is coated on the first protection film 31 by the spin coating method so as to cover the source electrode 4, the drain electrode 5, and the gate electrode 7 as same as the first embodiment. The second protection film 9 is thereby formed.

After that, contact holes which expose the surfaces of the source electrode 4, the drain electrode 5 are formed at the second protection film 9 and the first protection film 31, and a contact hole which exposes the surface of the gate electrode 7 is formed at the second protection film 9. The AlGaN/GaN.HEMT according to the embodiment is formed by going through the various processes such as the formation of the wirings to be connected to these electrodes.

As described hereinabove, according to the embodiment, it is possible to enable the AlGaN/GaN.HEMT with high reliability and high withstand voltage which reduces the hydroxyl group (—OH) and the adsorbed water bound to the hydroxyl group in the first protection film 31, and suppresses the current collapse.

Fourth Embodiment

In the embodiment, a configuration and a manufacturing method of an AlGaN/GaN.HEMT are disclosed as same as the first embodiment, but they are different in a point that a forming state of the second protection film is different. Note that the same reference numerals are supplied as for the same components or the like as the first embodiment, and detailed descriptions are not given.

FIGS. 12A to 12C, FIGS. 13A to 13C are schematic sectional views each illustrating a major process of the manufacturing method of the AlGaN/GaN.HEMT according to a fourth embodiment.

In the embodiment, the various processes of FIG. 1A to FIG. 3A are gone through as same as the first embodiment. At this time, the hydrophobic layer 8 is formed at the surface of the first protection film 6.

Figure 12A:
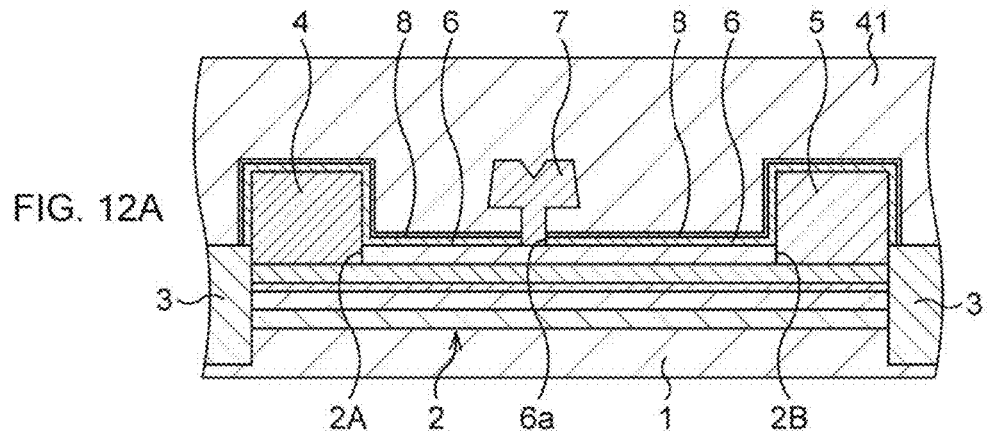
FIGS. 12A to 12C are schematic sectional views each illustrating a major process of a manufacturing method of an AlGaN/GaN.HEMT according to a fourth embodiment.

Subsequently, as illustrated in FIG. 12A, an organic film 41 is formed.

In detail, a filling material is formed on the first protection film 6 at a whole surface on the compound semiconductor stacked structure 2 so as to cover the source electrode 4, the drain electrode 5, and the gate electrode 7. As the filling material, it is not particularly limited as long as it is a photo-decomposable material, for example, an organic material which is decomposed by ultraviolet ray with a wavelength of approximately 250 nm or more and 400 nm or less, and has a $C_xH_y$ skeleton. The organic material is coated by, for example, the spin coating method. Note that as the filling material, it is also possible to use polypropylene, polycarbonate, and so on. An organic film 41 embedding the gate electrode 7 is thereby formed on the compound semiconductor stacked structure 2.

Figure 12B:
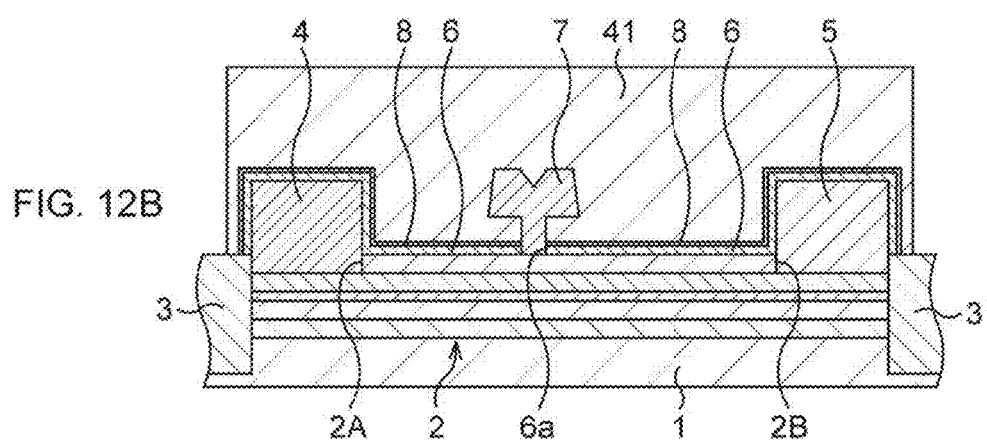

Subsequently, as illustrated in FIG. 12B, the organic film 41 is processed.

In detail, the organic film 41 is processed by the lithography and the dry-etching, and the organic film 41 is remained at a predetermined portion. In the embodiment, the organic film 41 is remained at a formation planned portion of a later-described cavity, namely, a portion covering on, for example, the first protection film 6 so as to include the gate electrode 7, the source electrode 4, and the drain electrode 5.

Figure 12C:
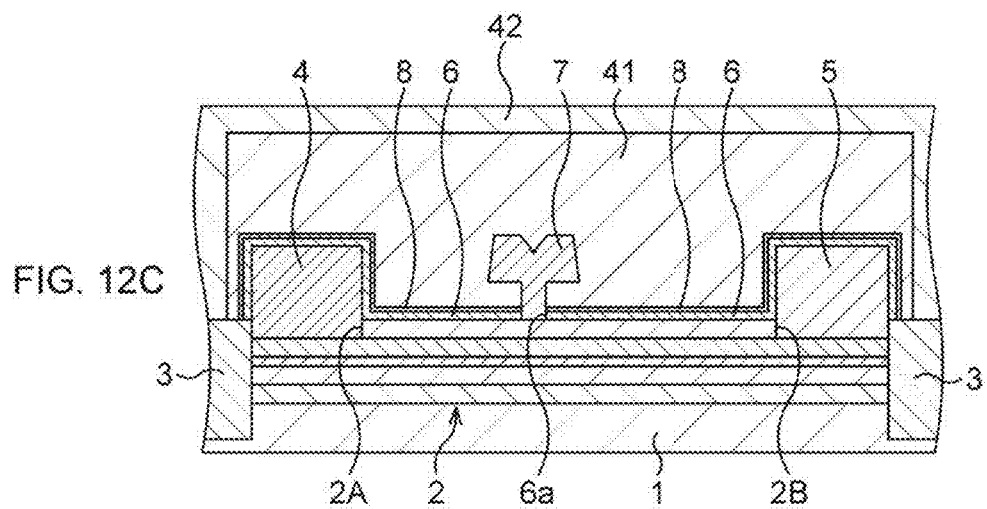

Subsequently, as illustrated in FIG. 12C, a second protection film 42 is formed.

In detail, a porous insulating material having a characteristic transmitting ultraviolet ray and being a low dielectric constant material is formed at the whole surface on the compound semiconductor stacked structure 2 so as to cover the organic film 41. As the porous insulating material, for example, porous silica is used. It is also possible to use organosiloxane or siloxane hydroxide which contains Si as a component, or both of them other than the porous silica. Besides, it is also possible to use organic polymer which contains Si as a component as the porous insulating material. The second protection film 42 covering the organic film 41 is thereby formed on the compound semiconductor stacked structure 2.

Figure 13A:
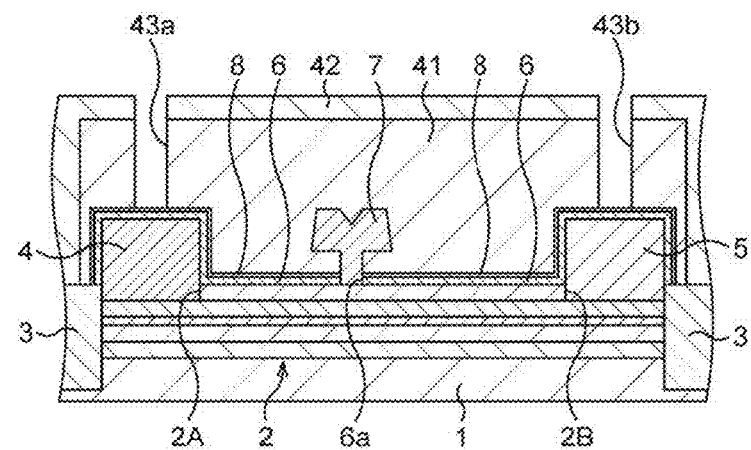
FIGS. 13A to 13C are schematic sectional views each illustrating the major process of the manufacturing method of the AlGaN/GaN.HEMT according to the fourth embodiment subsequent to FIG. 12C.

Subsequently, as illustrated in FIG. 13A, contact holes 43a, 43b are formed at the first protection film 6, the organic film 41, and the second protection film 42.

In detail, the first protection film 6, the organic film 41, and the second protection film 42 are processed by the lithography and the dry-etching. Contact holes respectively exposing a part of the surface of the source electrode 4, a part of the surface of the drain electrode 5, and a part of the surface of the gate electrode 7 are thereby formed at the first protection film 6, the organic film 41, and the second protection film 42. In FIG. 13A, only the contact holes 43a, 43b respectively exposing a part of the surface of the source electrode 4 and a part of the surface of the drain electrode 5 are illustrated.

Figure 13B:
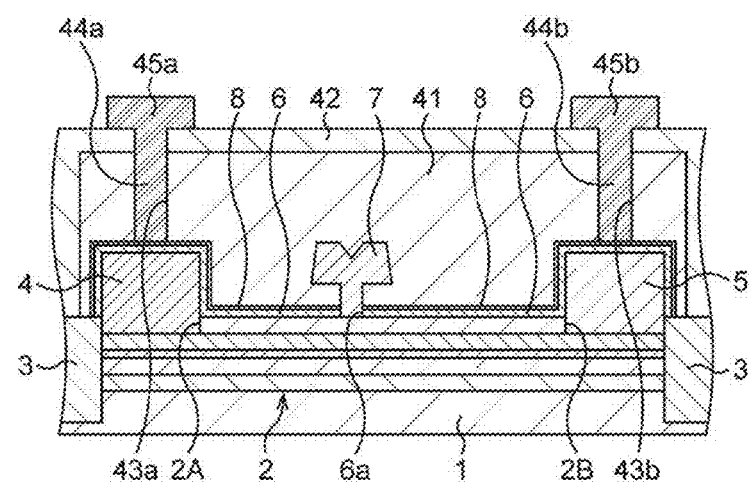

Subsequently, as illustrated in FIG. 13B, wirings 45a, 45b are formed.

In detail, at first, a conductive film, here, for example, TiW/Au as a two-layer metal film is deposited on a whole surface of the second protection film 42 so as to embed the contact holes 43a, 43b by the sputtering method. As for the metal film, TiW is a lower layer and is formed on the second protection film 42 to cover internal surfaces of the contact holes 43a, 43b, and Au is an upper layer, and is formed on the second protection film 42 to embed the contact holes 43a, 43b via TiW. Note that the metal film is formed to similarly embed the contact hole which exposes a part of the surface of the gate electrode 7.

Next, a resist is coated on the metal film, this resist is processed by the lithography, and a resist mask having openings corresponding to desired wirings is formed on the metal film. For example, insides of the openings of the resist mask are embedded with Au by the Au plating method, and the resist mask is removed by the ashing treatment or the wet treatment.

An excessive metal film on the second protection film 42 is removed by the lithography and the dry-etching. The wirings 45a, 45b which extend on the second protection film 42 and are made up by being electrically connected to the source electrode 4 and the drain electrode 5 via connection parts 44a, 44b which fill the contact holes 43a, 43b with TiW/Au are thereby formed. Note that a wiring which is made up by being electrically connected to the gate electrode 7 via a connection part which fills the contact hole with TiW/Au is also formed as same as the wirings 45a, 45b.

Figure 13C:
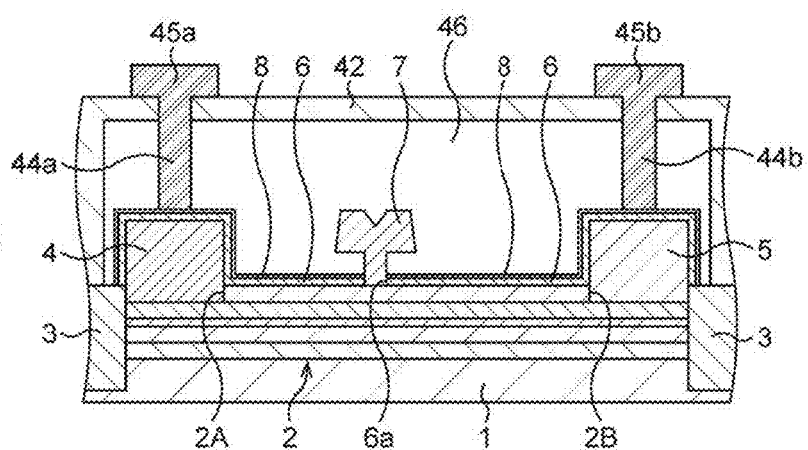

Subsequently, as illustrated in FIG. 13C, the organic film 41 is removed, and a cavity 46 is formed at the second protection film 42.

In detail, ultraviolet ray with a wavelength of approximately 250 nm or more and 400 nm or less, for example, approximately 254 nm is irradiated at the second protection film 42 in vacuum. The second protection film 42 is the porous insulating material having the characteristic transmitting ultraviolet ray, and therefore, the irradiated ultraviolet ray is transmitted through the second protection film 42 and reaches the organic film 41. The organic film 41 is the material having the characteristic being decomposed by ultraviolet ray, and therefore, it is photo-decomposed by the irradiation of ultraviolet ray, and is removed via holes of the second protection film 42. The organic film 41 is thereby removed, and the cavity 46 is formed between the second protection film 42 and the first protection film 6.

The cavity 46 is formed at a portion where the organic film 41 existed. The organic film 41 was formed at the portion covering on the first protection film 6 so as to include the gate electrode 7, the source electrode 4, and the drain electrode 5. Therefore, the cavity 46 is to be formed between the second protection film 42 and the surface of the gate electrode 7, the surface of the source electrode 4, the surface of the drain electrode 5, and a part of each of surfaces of the connection parts 44a, 44b (further a part of a surface of the connection part of the gate electrode 7) via the first protection film 6.

The cavity 46 is formed between the first protection film 6 and the second protection film 42, and thereby, a parasitic capacitance when there is an interlayer insulating film at around the gate electrode 7 is reduced as much as possible, a maximum operating frequency improves, and an excellent high-frequency characteristic is obtained.

After that, the AlGaN/GaN.HEMT according to the embodiment is formed by going through post-processes such as an electrical connection of the wirings 45a, 45b (further, the wiring of the gate electrode 7).

As described hereinabove, according to the embodiment, it is possible to enable the AlGaN/GaN-HEMT with high reliability and high withstand voltage which reduces the hydroxyl group (—OH) and the adsorbed water bound to the hydroxyl group in the first protection film 6, and suppresses the current collapse.

Note that in each of the second to fourth embodiments, the gate electrode 7 may be formed after the hydrophobic layer

8 is formed by silylating the surface of the first protection film 6 as same as the modification example of the first embodiment.

Besides, in each of the second to fourth embodiments, the silane compound in liquid state may be used instead of the vapor state silane compound, and the silylation process may be performed by, for example, the spin coating method.

Fifth Embodiment

In the embodiment, a power supply device where one kind of AlGaN/GaN.HEMT selected from the modification example of the first embodiment and the second to fourth embodiments is applied, is disclosed.

Figure 14:
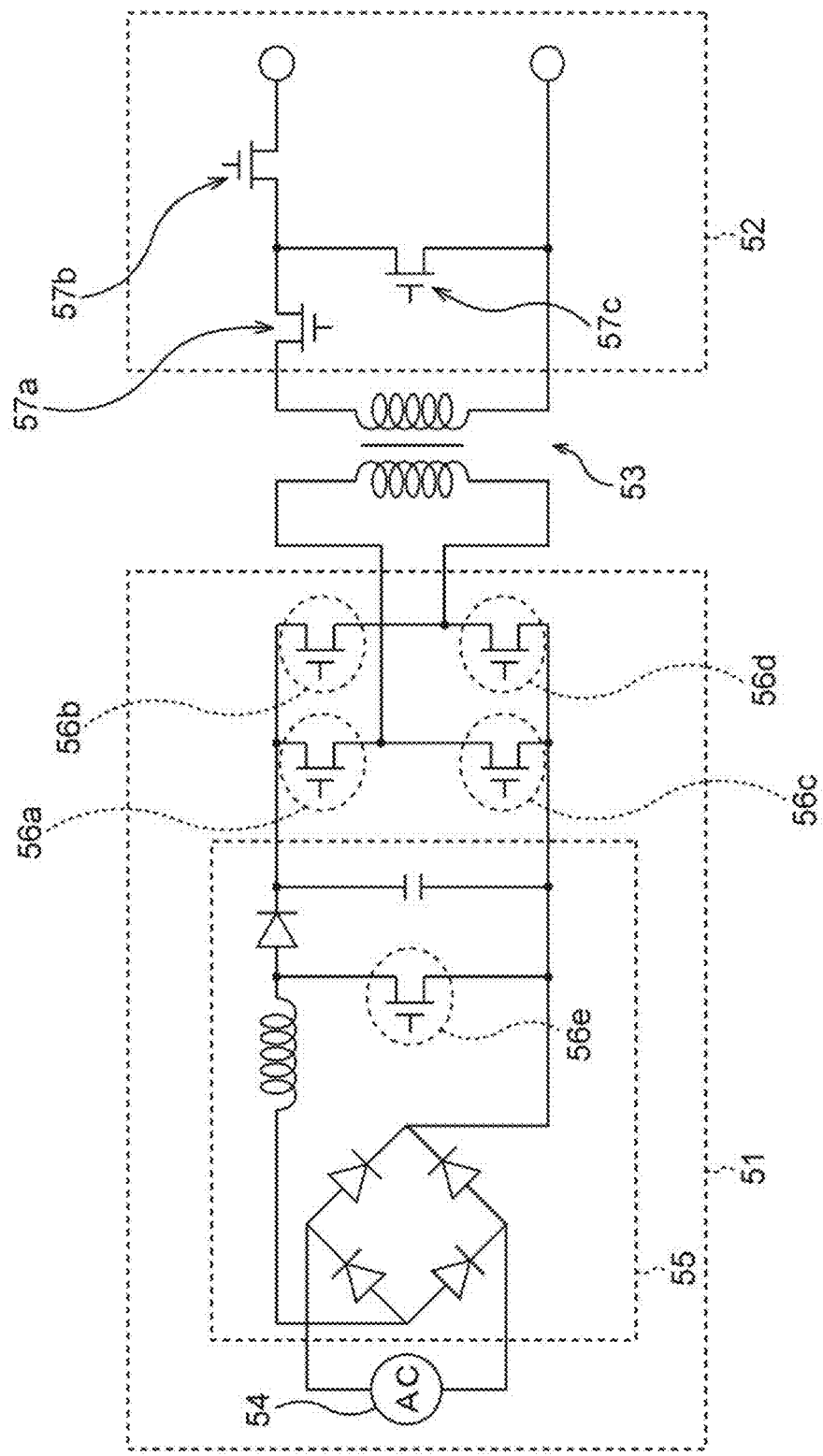
FIG. 14 is a connection diagram illustrating a schematic configuration of a power supply device according to a fifth embodiment.

FIG. 14 is a connection diagram illustrating a schematic configuration of a power supply device according to a fifth embodiment.

The power supply device according to the embodiment is made up by including a high-voltage primary-side circuit 51 and a low-voltage secondary-side circuit 52, and a transformer 53 provided between the primary-side circuit 51 and the secondary-side circuit 52.

The primary-side circuit 51 is made up by including an alternating-current power supply 54, so-called a bridge rectifying circuit 55, and a plurality (here, four pieces) of switching elements 56*a*, 56*b*, 56*c*, 56*d*. Besides, the bridge rectifying circuit 55 includes a switching element 56*e*.

The secondary-side circuit 52 is made up by including a plurality (here, three pieces) of switching elements 57*a*, 57*b*, 57*c*.

In the embodiment, the switching elements 56*a*, 56*b*, 56*c*, 56*d*, 56*e* of the primary-side circuit 51 are one kind of AlGaN/GaN.HEMT selected from the modification example of the first embodiment and the second to fourth embodiments. On the other hand, the switching elements 57*a*, 57*b*, 57*c* of the secondary-side circuit 52 are each a normal MIS.FET using silicon.

In the embodiment, the water repellency of the first protection film covering the surface of the compound semiconductor stacked structure is secured, and thereby, the high-withstand voltage AlGaN/GaN.HEMT which suppresses the current collapse is applied to the high-voltage circuit. The high-reliability and high-power power supply circuit is thereby enabled.

Sixth Embodiment

In the embodiment, a high-frequency amplifier where one kind of AlGaN/GaN.HEMT selected from the modification example of the first embodiment and the second to fourth embodiments is applied is disclosed.

Figure 15:
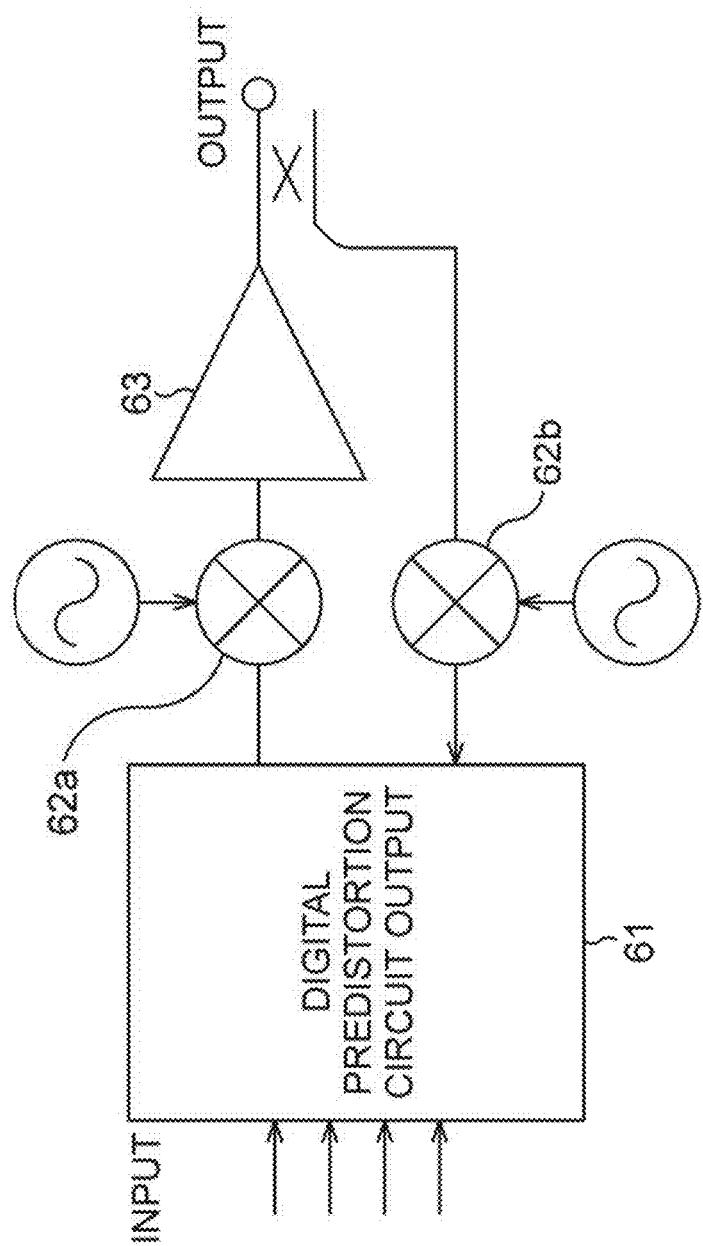
FIG. 15 is a connection diagram illustrating a schematic configuration of a high-frequency amplifier according to a sixth embodiment.

FIG. 15 is a connection diagram illustrating a schematic configuration of a high-frequency amplifier according to a sixth embodiment.

The high-frequency amplifier according to the embodiment is made up by including a digital predistortion circuit 61, mixers 62*a*, 62*b*, and a power amplifier 63.

The digital predistortion circuit 61 is one compensating nonlinear distortion of an input signal. The mixer 62*a* is one mixing the input signal whose nonlinear distortion is compensated and an alternating-current signal. The power amplifier 63 is one amplifying the input signal which is mixed with the alternating-current signal, and includes one kind of AlGaN/GaN.HEMT selected from the modification example of the first embodiment and the second to fourth embodiments. Note that in FIG. 15, it is configured such that an output-side signal is mixed with the alternating-current signal by the mixer 62*b* and sends out to the digital predistortion circuit 61 by, for example, switching the switch.

In the embodiment, the water repellency of the first protection film covering the surface of the compound semiconductor stacked structure is secured, and thereby, the high-withstand voltage AlGaN/GaN.HEMT which suppresses the current collapse is applied to the high-frequency amplifier. The high-reliability and high-withstand voltage high-frequency amplifier is thereby enabled.

Other Embodiments

In the first to sixth embodiments, the AlGaN/GaN.HEMT is exemplified as the compound semiconductor device. As the compound semiconductor device, it is also possible to apply to the HEMTs as described below in addition to the AlGaN/GaN.HEMT.

Other HEMT Example 1

In the example, an InAlN/GaN.HEMT is disclosed as the compound semiconductor device.

InAlN and GaN are compound semiconductors which are able to bring the lattice constants closer depending on a composition thereof. In this case, in the above-stated first to sixth embodiments, the electron transit layer is formed by i-GaN, the intermediate layer is formed by i-InAlN, the electron supply layer is formed by n-InAlN, and the cap layer is formed by n-GaN. Besides, the piezoelectric polarization seldom occurs in this case, and therefore, the two-dimensional electron gas is mainly generated by the spontaneous polarization of InAlN.

According to the example, the water repellency of the first protection film covering the surface of the compound semiconductor stacked structure is secured as same as the above-stated AlGaN/GaN.HEMT, and thereby, the high-reliability and high-withstand voltage InAlN/GaN.HEMT which suppresses the current collapse is enabled.

Other HEMT Example 2

In the example, an InAlGaN/GaN.HEMT is disclosed as the compound semiconductor device.

GaN and InAlGaN are compound semiconductors where the latter is able to make the lattice constant smaller than the former depending on the composition. In this case, in the above-stated first to sixth embodiments, the electron transit layer is formed by i-GaN, the intermediate layer is formed by i-InAlGaN, the electron supply layer is formed by n-InAlGaN, and the cap layer is formed by n-GaN.

According to the example, the water repellency of the first protection film covering the surface of the compound semiconductor stacked structure is secured as same as the above-stated AlGaN/GaN.HEMT, and thereby, the high-reliability and high-withstand voltage InAlGaN/GaN.HEMT which suppresses the current collapse is enabled.

According to the various modes, a compound semiconductor device with high reliability and high withstand voltage which reduces a hydroxyl group (—OH) and adsorbed water bound to the hydroxyl group in a protection film being an origin of an electron trap and suppresses the current collapse.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. A compound semiconductor device, comprising:
a compound semiconductor layer; and
a first protection film which covers a surface of the compound semiconductor layer,
wherein a hydrophobic layer containing Si—$C_xH_y$ is formed at a surface of the first protection film,
wherein as for the Si—$C_xH_y$, x>"0" (zero), y>"0" (zero), and $C_xH_y$ represents a substituent which contains C, H, and
wherein the first protection film is a stacked structure of a stoichiometric first silicon nitride film and a non-stoichiometric second silicon nitride film on the stoichiometric first silicon nitride film.

2. The compound semiconductor device according to claim 1,
wherein in the first protection film, a carbon concentration at the hydrophobic layer is higher than the carbon concentration at a part other than the hydrophobic layer.

3. The compound semiconductor device according to claim 1,
wherein the first protection film is an insulating film whose major constituent is Si and at least one element between O and N.

4. The compound semiconductor device according to claim 1,
wherein the second protection film is an insulating film whose major constituent is two elements of Si and N, three elements of Si, N and O, or three elements of Si, C and O.

5. The compound semiconductor device according to claim 1, further comprising:
a second protection film which is formed above the first protection film.

6. The compound semiconductor device according to claim 5,
wherein in the second protection film, a density of is smaller and a dielectric constant is lower than the first protection film.

7. The compound semiconductor device according to claim 5,
wherein a cavity is formed between the first protection film and the second protection film.

8. A compound semiconductor device, comprising:
a compound semiconductor layer; and
a first protection film which covers a surface of the compound semiconductor layer,
wherein a hydrophobic layer containing Si—$C_xH_y$ is formed at a surface of the first protection film,
wherein as for the Si—$C_xH_y$, x>"0" (zero), y>"0" (zero), and $C_xH_y$ represents a substituent which contains C, H, and
wherein the first protection film is a stacked structure of a silicon nitride film and a silicon carbide film on the silicon nitride film.

9. A manufacturing method of a compound semiconductor device, comprising:
forming a compound semiconductor layer;
forming a first protection film which covers a surface of the compound semiconductor layer; and
forming a hydrophobic layer which contains Si—$C_xH_y$ at a surface of the first protection film by performing a silylation process on Si—OH existing at the surface of the first protection film by using a silane compound,
wherein as for the Si—$C_xH_y$, x>"0" (zero), y>"0" (zero), and $C_xH_y$ represents a substituent which contains C, H, and
wherein the first protection film is formed to be a stacked structure of a stoichiometric first silicon nitride film and a non-stoichiometric second silicon nitride film on the stoichiometric first silicon nitride film.

10. The manufacturing method of the compound semiconductor device according to claim 9,
wherein in the first protection film, a carbon concentration at the hydrophobic layer is higher than the carbon concentration at a part other than the hydrophobic layer.

11. The manufacturing method of the compound semiconductor device according to claim 9,
wherein the first protection film is an insulating film whose major constituent is Si and at least one element between O and N.

12. The manufacturing method of the compound semiconductor device according to claim 9,
wherein the second protection film is an insulating film whose major constituent is two elements of Si and N, three elements of Si, N and O, or three elements of Si, C and O.

13. The manufacturing method of the compound semiconductor device according to claim 9,
wherein the silylation process is performed by using the silane compound in vapor state.

14. The manufacturing method of the compound semiconductor device according to claim 9,
wherein the silylation process is performed by using the silane compound in liquid state.

15. The manufacturing method of the compound semiconductor device according to claim 9, further comprising:
forming electrodes above the compound semiconductor layer,
wherein the hydrophobic layer is formed before or after the forming the electrodes.

16. The manufacturing method of the compound semiconductor device according to claim 9, further comprising:
forming a second protection film above the first protection film.

17. The manufacturing method of the compound semiconductor device according to claim 16,
wherein in the second protection film, a density is smaller and a dielectric constant is lower than the first protection film.

18. The manufacturing method of the compound semiconductor device according to claim 16,
wherein the second protection film is formed to form a cavity between the second protection film and the first protection film.

19. A manufacturing method of a compound semiconductor device, comprising:
forming a compound semiconductor layer;
forming a first protection film which covers a surface of the compound semiconductor layer; and
forming a hydrophobic layer which contains Si—$C_xH_y$ at a surface of the first protection film by performing a silylation process on Si—OH existing at the surface of the first protection film by using a silane compound;

wherein as for the Si—$C_xH_y$, x>"0" (zero), y>"0" (zero), and $C_xH_y$ represents a substituent which contains C, H, and wherein the first protection film is formed to be a stacked structure of a silicon nitride film and a silicon carbide film on the silicon nitride film.

20. A power supply circuit, comprising:

a transformer; and a high-voltage circuit and a low-voltage circuit with the transformer between them, the high-voltage circuit comprising:

a transistor, the transistor comprising:

a compound semiconductor layer; and a first protection film which covers a surface of the compound semiconductor layer, wherein a hydrophobic layer containing Si—$C_xH_y$ is formed at a surface of the first protection film, wherein as for Si—$C_xH_y$, x>"0" (zero), y>"0" (zero), and $C_xH_y$ represents a substituent which contains C, H, and wherein the first protection film is a stacked structure of a stoichiometric first silicon nitride film and a non-stoichiometric second silicon nitride film on the stoichiometric first silicon nitride film.

21. A high-frequency amplifier which amplifies and outputs an input high-frequency voltage, comprising:

a transistor, the transistor comprising:

a compound semiconductor layer; and a first protection film which covers a surface of the compound semiconductor layer, wherein a hydrophobic layer containing Si—$C_xH_y$ is formed at a surface of the first protection film, wherein as for Si—$C_xH_y$, x>"0" (zero), y>"0" (zero), and $C_xH_y$ represents a substituent which contains C, H, and wherein a part other than the hydrophobic layer of the first protection film is a stacked structure of a stoichiometric first silicon nitride film and a non-stoichiometric second silicon nitride film on the stoichiometric first silicon nitride film.

22. A power supply circuit, comprising:

a transformer; and a high-voltage circuit and a low-voltage circuit with the transformer between them, the high-voltage circuit comprising:

a transistor, the transistor comprising:

a compound semiconductor layer; and a first protection film which covers a surface of the compound semiconductor layer, wherein a hydrophobic layer containing Si—$C_xH_y$ is formed at a surface of the first protection film, wherein as for Si—$C_xH_y$, x>"0" (zero), y>"0" (zero), and $C_xH_y$ represents a substituent which contains C, H, and wherein the first protection film is a stacked structure of a silicon nitride film and a silicon carbide film on the silicon nitride film.

23. A high-frequency amplifier which amplifies and outputs an input high-frequency voltage, comprising:

a transistor, the transistor comprising:

a compound semiconductor layer; and a first protection film which covers a surface of the compound semiconductor layer, wherein a hydrophobic layer containing Si—$C_xH_y$ is formed at a surface of the first protection film, wherein as for Si—$C_xH_y$, x>"0" (zero), y>"0" (zero), and $C_xH_y$ represents a substituent which contains C, H, and wherein the first protection film is a stacked structure of a silicon nitride film and a silicon carbide film on the silicon nitride film.

\* \* \* \* \*